United States Patent [19]

Klossner et al.

[11] Patent Number: 5,176,289
[45] Date of Patent: Jan. 5, 1993

[54] DIRECT VERTICAL PIN FEEDER

[75] Inventors: David J. Klossner, Vestal; Michael J. Yurko, Endicott, both of N.Y.

[73] Assignee: International Business Machines Corp., Armonk, N.Y.

[21] Appl. No.: 734,703

[22] Filed: Jul. 23, 1991

[51] Int. Cl.⁵ ............................................. B23Q 7/12
[52] U.S. Cl. ................................. 221/168; 221/200; 198/418.1; 198/389
[58] Field of Search ............. 221/167, 168, 170, 200, 221/266; 198/389, 368, 463.6, 418.1, 424, 391; 29/712, 701, 783, 759, 753, 748, 863

[56] References Cited

U.S. PATENT DOCUMENTS

| | | | |
|---|---|---|---|
| 2,433,010 | 12/1947 | Woodberry et al. | 86/48 |
| 2,675,120 | 4/1954 | Autenrieth et al. | 198/37 |
| 3,295,661 | 1/1967 | Mitchell, Jr. et al. | 198/33 |
| 3,907,099 | 9/1975 | Smith | 198/220 BC |
| 4,206,539 | 6/1980 | Weresch | 29/566.3 |
| 4,348,806 | 9/1982 | Eves et al. | 29/863 |
| 4,383,359 | 5/1983 | Suzuki et al. | 29/712 |
| 4,821,864 | 4/1989 | Lock et al. | 198/368 |

Primary Examiner—D. Glenn Dayoan
Assistant Examiner—Kenneth Noland
Attorney, Agent, or Firm—Judith D. Olsen; Lawrence R. Fraley

[57] ABSTRACT

Disclosed is a pin feeder for supplying contact pins in a high density interstitial pattern in a printed circuit carrier. The feeder apparatus eliminates the use of tubes, and features instead vertical vibration in combination with a honeycomb feeder plate configuration, thereby providing a process and apparatus for pin feeding with greatly improved reliability, reduced jamming and greater flexibility in its applications.

6 Claims, 6 Drawing Sheets

DIRECT VERTICAL PIN FEEDER

BACKGROUND OF THE INVENTION

1. Field of the Invention

This invention relates to a method and apparatus for feeding and assembling pins into holes prepared in circuitized carriers for ultimate use in electronic packages.

The pins are electronically conductive, typically comprising gold or copper on at least an electrically continuous surface, and having been affixed in place through holes in a first major surface in a circuitized carrier, such as a semiconductor chip, printed circuit board, and the like, emerge from the opposite, i.e. second major surface where they are available for further processing, such as soldering to conductive regions on a surface or within prepared holes in another circuitized carrier. In this manner, compact and efficient electronic packages can be constructed.

2. Background Art

In the past, small shaped objects have been supplied from a vibratory bowl or an inline horizontal vibratory feeder or a belt/cam feeder often through a series of tubes to a shuttle mechanism and then into a carrier. Examples of the rotary bowl type vibratory feeder are described in U.S. Pat. Nos. 3,907,099, 4,348,806, 3,295,661, 4,383,359 and 4,206,539. An example of an inline horizontal vibratory feeder is described in U.S. Pat. No. 4,821,864. Examples of mechanical belt/cam feeders are described in U.S. Pat. Nos. 2,675,120 and 2,433,010.

The feeders described in the existing art are intended to handle a variety of parts. For example, feed of oriented parts having heads is described in U.S. Pat. Nos. 3,907,099, 2,433,010, 4,348,806, 4,821,864 and 3,295,661. Feed of oriented parts of a variety of shapes is described in U.S. Pat. Nos. 4,383,359 and 4,206,539. Feed of granular food particles is described in U.S. Pat. No. 2,675,120. In contrast, the pins fed in the present invention are conductive, headless pins substantially identical to one another and not oriented prior to feeding.

Two methods of delivering parts, such as conductive pins, into a carrier, such as a printed circuit board or semiconductor chip, have been used. The first method employs a full matrix of tubes positioned over the carrier wherever the predetermined pattern requires a pin. The pins pass through the matrix of tubes from a vibratory feeder, and the flow of pins from the tubes is periodically interrupted by a shuttle mechanism.

The second method, a row by row scan drop method, employs only a single row of tubes leading from a vibratory feeder at one end and mounted on a sliding mechanism on the other. The slide scans across a receiving shuttle dropping one row of pins at a time until a total scan of the slide includes a complete pin matrix. The completed pin matrix is then dropped from the slide into the carrier.

Problems with existing feeders include frequent bending of pins and jamming of pins in delivery tubes. Music wire is typically run down into the jammed tube in an attempt to clear the jam. In some cases the mechanism has to be disassembled and cleared. There is risk that use of music wire will cause damage to the tube and tube assembly.

With small pins, static cling can be generated from the friction between the pins and tubes as the pins typically travel about 2.5 feet down the tubes to the shuttle, resulting in jamming.

The row by row scan drop method relies on the pin dropping completely into the receiving hole of the shuttle before the slide reaches the far side of the hole. Pins are sheared off or bent if the pin does not drop completely into the hole, and the mechanism must be cleared or disassembled before continued operation. A proclivity to jam necessitates frequent operator intervention, continual operator vigilance and component waste.

An additional problem is presented by a new high density product, which features interstitial patterns. The proximity of the pins to each other, the number of pins and their interstitial arrangement make previous methods of pin feeding obsolete. Tubes cannot be positioned close enough to each other in order to accomplish interstitial pinning in a high density matrix grid.

SUMMARY OF THE INVENTION

It is therefore an object of the invention to provide a feeder for conductor pins and a method for feeding conductor pins into through holes prepared to receive them in a carrier.

It is a further object of the invention to provide a pin feeder and method for feeding pins which eliminates the use of pin delivery tubes.

It is a further object of the invention to provide a pin feeder and a method for feeding pins which is substantially trouble free, requiring minimal operator intervention, minimal waste of pins and carrier and at a commercially viable speed of pin feeding.

It is still a further object of the invention to provide a pin feeder and a method for supplying pins into an interstitial pattern of through holes in a high density carrier.

The limitations of the prior art are overcome and the objects of the invention are attained by the direct vertical vibrating pin feeder and the method of pinning through use of the direct vertical vibrating feeder described herein.

The method and apparatus of the present invention involves the supply of a complete pin matrix directly from a pin feeder into a shuttle without the use of tubes.

In response to the signal from a pin sense detector, a supply of pins is dumped from a bulk feeder into a vibrator box. The vertical vibration of the box causes the pins to stand on end. The vibrating pins proceed from the vibrator box down through holes until a means for sensing, such as a proximity sensor, detects the presence of pins. A signal shuts off the vertical vibration until it is detected that additional pins are needed, at which point the vertical vibration is turned on again. The pins are oriented in the vertical position in a grid of holes having diameters larger than that of the pins but not so large that the pins can become jammed sideways. The holes of which the grid of holes (feeder plate) is comprised are honeycomb shaped. Located in a program plate under each corner of each honeycomb hole is a smaller hole (pocket) with an angled countersink for directing pins through and into a shuttle plate. The angled countersink in the bottom side of the program plate provides clearance to allow shorter pins to be fed without causing a shear jam during shuttle plate shift. It also provides a complete open path for forced air back to the box to clear any pins that are not free. The pins proceed down through the program plate and into the shuttle plate below the program plate. The shuttle plate is preferably slightly thinner than the length of the pin.

This feature allows shorter pin lengths to be fed through without causing a jam.

The vibrator is turned off. When the carrier is in position under the pin feeder plate, the shuttle plate shifts a short distance laterally, dumping a complete pin matrix into a carrier. The vibrator is turned on again and the shuttle returns to its original position for more pins. This shift also stops the pins that are following from the program plate until the shuttle returns to the original position. The pins are held in position by a restrictor plate below the shuttle plate. In order to direct the pins into the pockets it is preferred that the pocket-to-pocket pitch be slightly greater than the length of the pin. It is preferred that the honeycomb feeder plate also be slightly thicker than the length of the pin. Vertical vibrating action will allow pins to enter into the pockets.

The vertical movement of the pins already in the pockets will hold back any horizontal pins which may be lying across the honeycomb matrix of the feeder plate. This feature prevents packing of the pins in the pockets and allows the vertical pins to seek out the holes in the program plate which lies below the honeycomb feeder plate.

A snap clip can be slid into position to control the amount of lateral restrictor plate shift and to facilitate vertical alignment of holes. This feature will permit any serious pin jams, which are rare, to be cleared by quills or air, either automatically or manually by an operator.

DETAILED DESCRIPTION OF THE DRAWINGS

In order to facilitate understanding of the present invention, reference is made to the following detailed description taken in conjunction with the above described figures.

Figure 1:
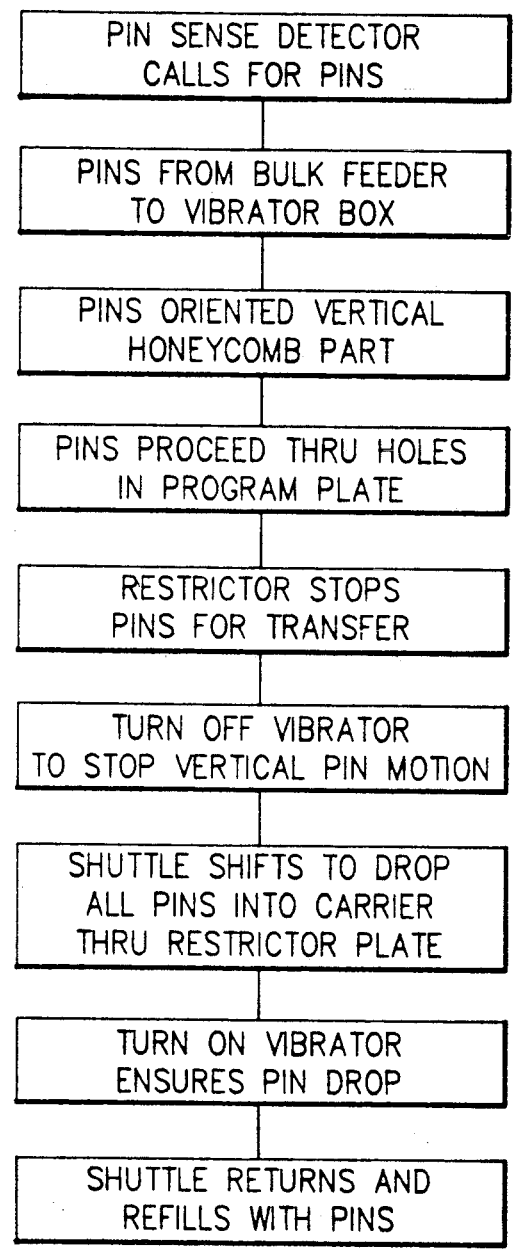
FIG. 1 is a flow chart of the overall process of the present invention.

In the process of the present invention, shown schematically in the flow chart of FIG. 1, a sense detector, such as a photocell or weight detector, 29 calls for the addition of pins from a bulk feeder to a supply box. A through-beam or reflective photocell, piezoelectric device or proximity sensor such as a Skan-A-Matic would be suitable. The supply box (vibrator box) is vibrated vertically using a device such as a Binder JP40 vertical vibrator, substantially setting the vibrating pins on end and dropping them into a plate having a honeycomb configuration of through holes. The pins, which are typically between about 0.320 inches and 0.328 inches long, are maintained substantially vertical within the honeycombs and fall through to holes in the program plate. From the holes in the program plate the pins are selected by a restrictor for transfer into a shuttle plate, which is slightly less than the length of the pins. The vibrator is turned off in order to stop the vertical motion of the pins. The shuttle shifts laterally into position to collect pins and upon collecting them shifts laterally again in the direction from which it came, dropping the pins through the restrictor plate into holes prepared to receive them in the carrier. Turning the vibrator on again at this point ensures that the pins will drop. The process continues with the shuttle shifting back and forth to refill with more pins and transfer them into the next carrier presented for pinning.

After pins have been supplied, the pinned carrier may be further processed, such as by die impaction, to form a head on each of the pins on at least one major side of the carrier, fixing the pins in place.

Figure 2:
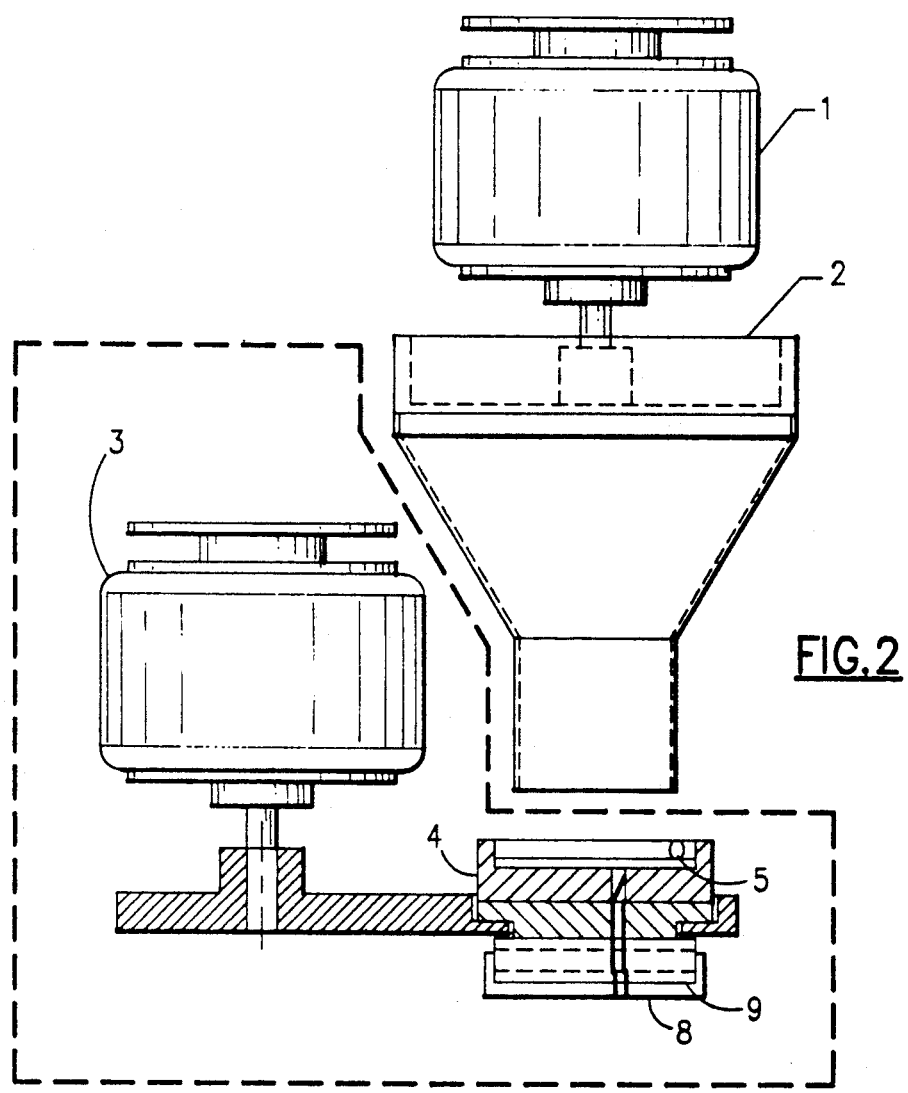
FIG. 2 shows the apparatus of the present invention.

FIG. 2 shows the vertical vibrator 1 and pin supply box 2, into which is supplied a number of contact pins (not shown) on an as-needed basis by a sensor 5 into the pin feeder box 4. The pin feeder box 4 is vibrated by vertical vibrator 3, as they are both mounted on the same frame.

Figure 3:
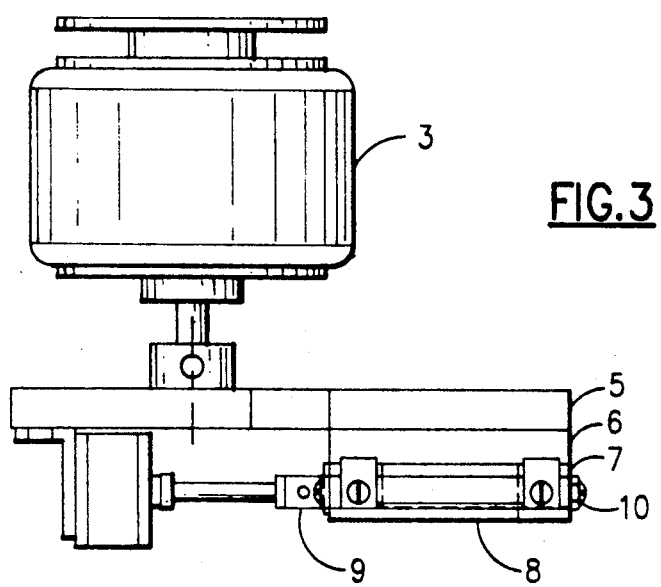
FIG. 3 shows the assembly which lies within the dotted line area of FIG. 2.

FIG. 3 shows the vertical vibrator 3 and an external view of the cross-section area shown within the dotted line in FIG. 3. The proximity sensor 5, pin feeder plate 6, program plate 7, restrictor plate 8, shuttle plate 9 and clip 10 are shown. Clip 10 serves to control the amount of lateral shift of the restrictor plate 8. The lateral shift aligns the holes in shuttle 4, program plate 7, to the holes in restrictor plate 8 for clearing of bent pins.

Figure 4:
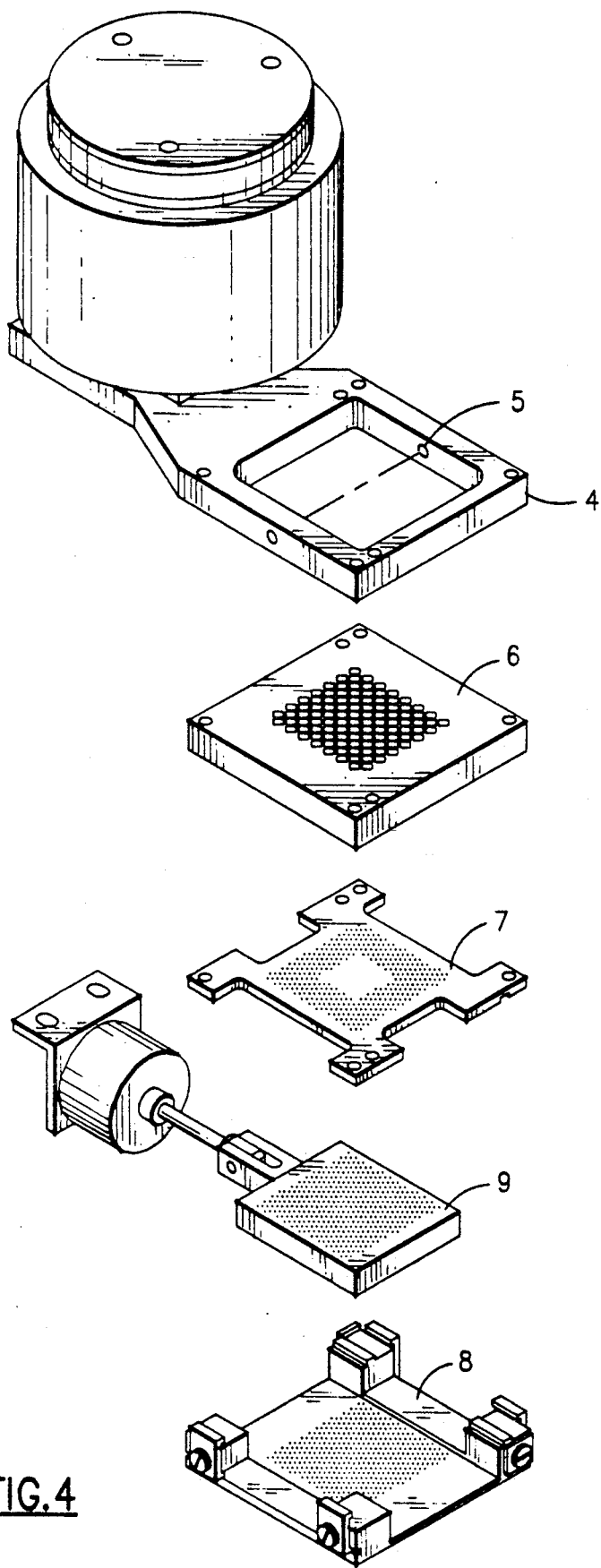
FIG. 4 shows the components of the FIG. 3 assembly separated from one another so that they may be viewed both individually and in context.
Figure 5A:
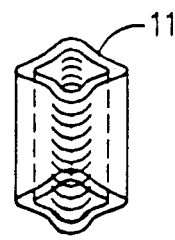
FIG. 5a is an isometric view of one honeycomb pocket of FIG. 5b.
Figure 5B:
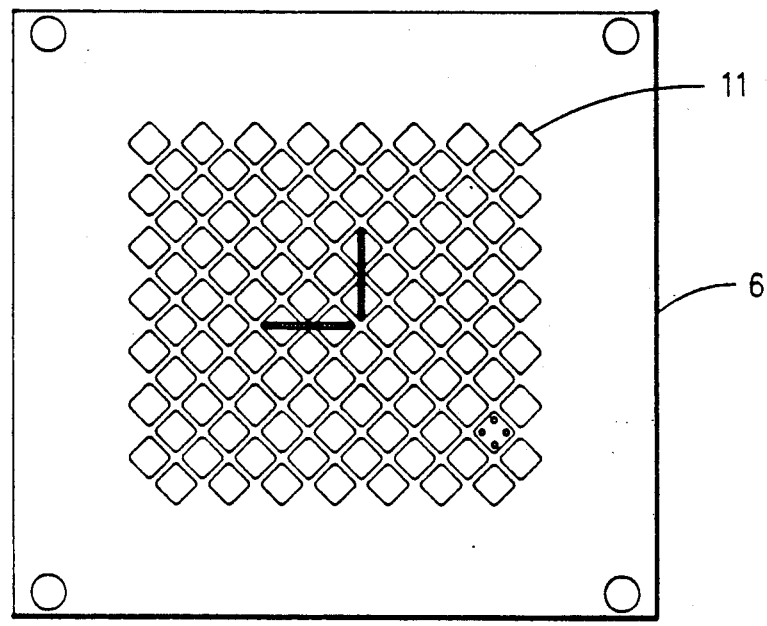
FIG. 5b is a top view of the honeycomb configuration for the honeycomb plate 2 seen in FIG. 4. Two pins are lying across the top at right angles to each other.
Figure 5C:
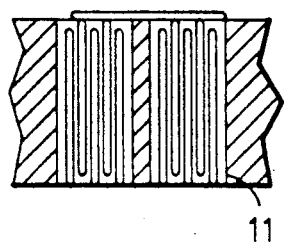
FIG. 5c is a side view of two pockets or the honeycomb configuration of FIG. 5b seen with pins inside, and one pin lying across the top.

The system is not sensitive to the rate of vibration as a range of about 10–120 Hertz was tried and all rates worked equally well. 60 Hertz was found adequate in all cases and was used customarily. The actual individual parts comprising the pin feeder and how they fit together are shown in FIG. 4. FIG. 5a is an isometric view of one honeycomb pocket 11. FIG. 5b show the honeycomb pin feeder plate 6 which includes a matrix of the honeycomb pockets shown in 5a. The particular array required by a carrier can be accommodated simply by changing the program plate to one of an appropriate design. FIGS. 5b and 5c show in top view and cutaway side view, respectively, the relationship between the dimensions of the honeycomb opening and those of the pins.

Located in the program plate under each of the four corners of each opening is a 0.022 inch diameter hole, aka pocket, having a 60 degree included angle countersink that aligns the pin and directs it through the program plate and into the shuttle, from which the complete pin matrix is supplied. The 60 degrees is not critical and is related to pin dimensions in that it bridges the initial opening, which should be wide enough to easily admit one pin and pass it into the hole in the program plate, but not wide enough to admit two pins simultaneously, which might prevent either from entering the program plate. It is not necessary to have this included angle, but is preferred because it eases the ability of the pin to find the hole in the program plate. The pins accommodated by the hole described are 0.016 mil or 0.020 mil in diameter, 0.328 mil in length, with a bullet nose profile, i.e., rounded taper, at each end. The thickness of the honeycomb feeder plate is just slightly greater than the length of the pins. The honeycomb hole is about 0.130 inches in diameter with a 0.030 radius in each corner. The relative sizes of pin and hole are selected such that the pins will not jam sideways. The pins do not jam, because they either lie horizontally across the top of the honeycomb plate or drop directly into a honeycomb pocket.

Figure 6A:
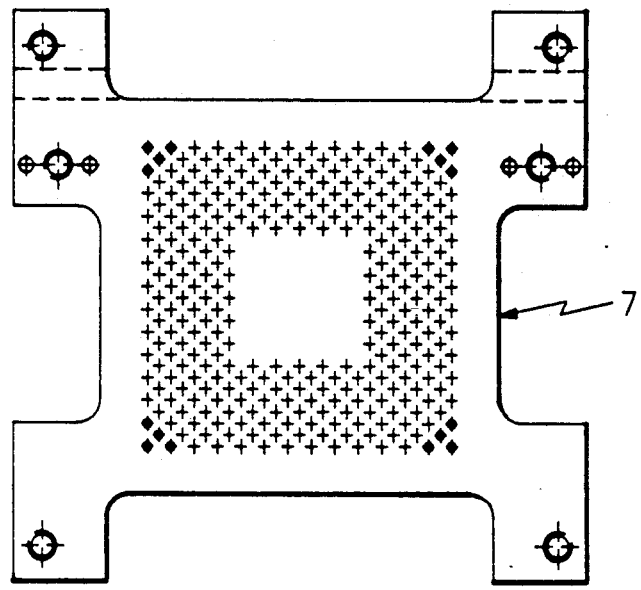
FIG. 6a is the program plate.
Figure 6B:
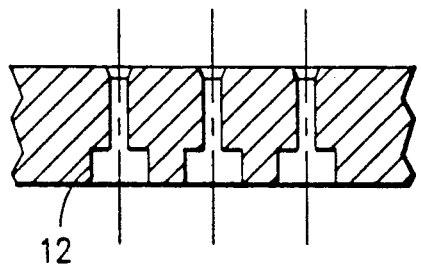
FIG. 6b is a side view of a program plate configuration of the program plate seen in FIG. 4.

The program plate 7 is singled out from FIG. 4 in the FIG. 6a top view, and FIG. 6b shows a cutaway side view of the shape of the holes 12 and the thickness of the program plate, which is slightly thinner than the length of the pins. The program plate controls the pin pattern.

Figure 7B:
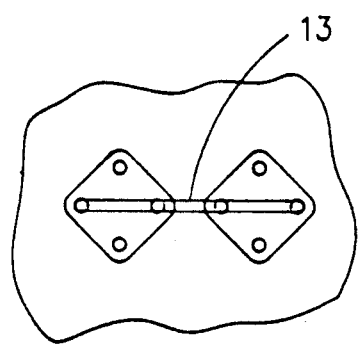
FIG. 7b shows a top view of two honeycomb pockets which are shown in cross-section in FIG. 7a. A pin is lying across the two pockets.
Figure 7A:
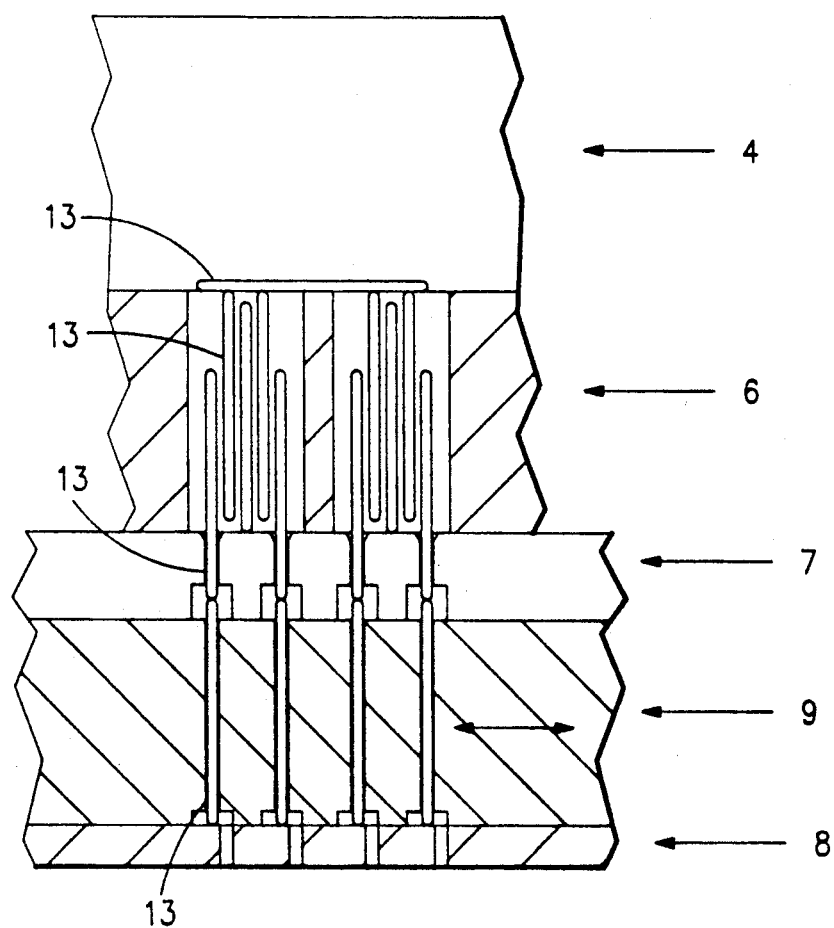
FIG. 7a shows a cross-sectional view, highly magnified, of pins progressing through the feeder assembly comprised of components shown separately in FIG. 4.

FIG. 7a shows in cross-section how the pins 13 progress through the assembled components which are shown separately in FIG. 4.

FIG. 7b shows a top view of the two honeycomb pockets seen in cross-section in FIG. 7a. A pin 13 lies across. In each honeycomb is seen four holes which are in the underlying program plate 7.

The vertical vibrator pin feeder described above and shown in the figures typically supplies about 45 to about 70 carrier parts per minute with pins in an interstitial pattern 100 mil × 100 mil standard. The 0.016 inch diameter pins permit an increased circuit density of four times that permitted by 0.020 inch pins, and 304 pins per second are supplied. In addition to the honeycomb shape, it is believed that the pin feeder does not jam, both because of the relationship of the external dimensions of the pins in relation to the internal dimensions of the holes of the various components through which they pass, and the fact that the vertical vibration keeps the pins jumping up and down and prevents too many from entering at any one time.

It is understood that the invention may be embodied in modified forms of the present invention without departing from the spirit or central characteristics thereof. The aforementioned examples and embodiments are therefore to be considered in all respects as illustrative rather than restrictive, and the invention is not to be limited to the details given herein.

What is claimed is:

1. A pin feeding apparatus including in combination:
   a. means for pin storage and supply;
   b. means for sensing the need for pins and initiating the supply of pins from the pin storage means;
   c. a supply box for receiving pins from the bulk container, vibrating the pins vertically and dropping the vertically vibrating pins into a pin feeder plate having honeycomb shaped through-holes;
   d. a pin feeder plate having honeycomb shaped through holes for maintaining the pins received from the supply box in a substantially vertical position and transferring them to a program plate;
   e. a program plate for receiving pins from the honeycomb pin feeder, determining the pattern in which pins will be transmitted, and transferring the pins to a shuttle plate;
   f. a restrictor for controlling transfer of pins between the program plate and a shuttle plate;
   g. a shuttle plate for receiving pins from the program plate, shifting to drop a full matrix of pins into the carrier and returning to receive additional pins from the program plate; and
   h. means for vertically vibrating pins as they move from parts a through g above.

2. The apparatus recited in claim 1, wherein the thickness of the program plate is slightly less than the length of the pins, the thickness of the shuttle plate is slightly less than the length of the pins, and the thickness of the honeycomb pin feeder plate is slightly greater than the length of the pins.

3. The apparatus recited in claim 1, wherein the individual honeycomb through-holes of the honeycomb pin feeder plate include at least one corner orifice.

4. The apparatus recited in claim 1, wherein the diameter of each individual honeycomb shaped hole of the pin feeder plate is selected with respect to pin length such that horizontal jamming of pins is substantially prevented.

5. A method for supplying pins to a carrier, comprising:
   a. sensing the need for pins;
   b. supplying pins to a supply box in response to the sensed need;
   c. providing that the pins be vibrated vertically;
   d. transferring pins from the supply box to a honeycomb pin feeder plate;
   e. positioning the pins to vertical in the honeycomb pin feeder plate;
   f. transferring the pins to a program plate;
   g. causing the pins to remain in the program plate by means of a restrictor plate;
   h. providing that the vertical vibration of the pins cease;
   i. transferring pins from the program plate to a shuttle plate;
   j. laterally transferring pins by means of a shuttle to a carrier; and
   k. providing that the vertical vibration of the pins be resumed to ensure pin drop.

6. The method recited in claim 5, including also the steps of:
   l. laterally returning the shuttle emptied of pins to its original position; and
   m. repeating steps a through l.

* * * * *